(12) United States Patent
Kim et al.

(10) Patent No.: US 7,552,368 B2
(45) Date of Patent: Jun. 23, 2009

(54) SYSTEMS AND METHODS FOR SIMULTANEOUSLY TESTING SEMICONDUCTOR MEMORY DEVICES

(75) Inventors: Joung-yeal Kim, Gyeonggi-do (KR); Kyoung-ho Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 551 days.

(21) Appl. No.: 10/823,076

(22) Filed: Apr. 13, 2004

(65) Prior Publication Data

US 2004/0252549 A1 Dec. 16, 2004

(30) Foreign Application Priority Data

Jun. 16, 2003 (KR) .................... 10-2003-0038890

(51) Int. Cl.
*G11C 29/00* (2006.01)

(52) U.S. Cl. ..................................... 714/718; 714/719

(58) Field of Classification Search ........................ None
See application file for complete search history.

(56) References Cited

U.S. PATENT DOCUMENTS

| | | | |
|---|---|---|---|
| 5,416,741 A | 5/1995 | Ohsawa et al. | 365/201 |
| 5,471,480 A | 11/1995 | You | |
| 5,809,225 A | 9/1998 | Ohsawa et al. | 714/32 |
| 6,163,863 A * | 12/2000 | Schicht | 714/718 |
| 6,252,805 B1 * | 6/2001 | So et al. | 365/189.07 |
| 6,301,171 B2 | 10/2001 | Kim et al. | 365/201 |
| 6,484,278 B1 * | 11/2002 | Merritt et al. | 714/719 |
| 6,550,026 B1 * | 4/2003 | Wright et al. | 714/719 |
| 6,567,939 B1 | 5/2003 | Kim | 714/718 |
| 6,636,998 B1 | 10/2003 | Lee et al. | 714/735 |
| 6,665,827 B2 * | 12/2003 | Ochoa et al. | 714/724 |
| 6,731,553 B2 * | 5/2004 | Fujioka et al. | 365/201 |
| 7,013,413 B1 * | 3/2006 | Kim et al. | 714/719 |
| 2002/0122343 A1 * | 9/2002 | Koshikawa | 365/200 |

FOREIGN PATENT DOCUMENTS

| | | |
|---|---|---|
| JP | 2002-269999 | 9/2002 |
| KR | 100172347 B1 | 10/1998 |
| KR | 100185635 B1 | 12/1998 |
| KR | 100211761 B1 | 5/1999 |

OTHER PUBLICATIONS

Korean Office Action corresponding to Korean Application No. 10-2003-0038890 dated Apr. 18, 2005.

* cited by examiner

*Primary Examiner*—Cynthia Britt
*Assistant Examiner*—Guerrier Merant
(74) *Attorney, Agent, or Firm*—Myers Bigel Sibley & Sajovec, P.A.

(57) ABSTRACT

A method for testing a memory cell array of a semiconductor memory device in a parallel bit test mode includes selecting first data from one of a plurality of memory regions in the memory array for output from the memory device via an input/output pad, and then selecting second data from another of the plurality of memory regions for output via the input/output pad. The first and second data can be selected from memory regions sharing a row select or a column select control line. Alternatively, one of the first and second data can be selected from memory regions sharing a row select control line, and the other can be selected from memory regions sharing a column select control line. Therefore, a parallel bit test can be performed using fewer input/output pads, and a larger number of semiconductor memory devices can simultaneously be tested. Related circuits are also discussed.

13 Claims, 6 Drawing Sheets

SYSTEMS AND METHODS FOR SIMULTANEOUSLY TESTING SEMICONDUCTOR MEMORY DEVICES

RELATED APPLICATION

This U.S. nonprovisional patent application claims priority under 35 U.S.C. § 119 from Korean Patent Application No. 2003-38890 filed Jun. 16, 2003, the entire contents of which is hereby incorporated by reference.

BACKGROUND OF THE INVENTION

1. Field of the Invention

The present invention relates to semiconductor memory devices, and more particularly to systems and methods for testing semiconductor memory devices.

2. Description of Related Art

Integrated circuit memory devices are widely used in consumer and commercial electronics. As the integration density of these devices continues to increase, the number of cells in a memory cell array may continue to increase. With the increased number of memory cells, it may become increasingly difficult to test the memory cell array.

As is well known to those of skill in the art, a memory cell array generally includes a plurality of data line outputs. In a normal, non-test mode, the data on the data line outputs can be transmitted to global output lines. In contrast, in a parallel bit test mode, a plurality of data bits can be concurrently output for comparison testing in a separate parallel bit test circuit.

A conventional semiconductor memory device tester may use a parallel bit test (PBT) technique to test more than one semiconductor memory device at the same time. The PBT technique does not receive or output data through all of the data I/O pads of the semiconductor memory devices, but only through a predetermined number of data I/O pads, thereby allowing for simultaneous testing of a larger number of semiconductor memory devices.

For example, if a tester has 32 data I/O terminals and a semiconductor memory device operating at a single data rate (SDR) receives or outputs 16-bit data, only two semiconductor memory devices can be tested simultaneously. However, using the PBT technique, 4 or 8 semiconductor memory devices can be tested at the same time, as data can be received or output through 8 or 4 data I/O pads, respectively.

FIG. 1 is a block diagram illustrating a conventional semiconductor memory device having a double data rate. The semiconductor memory device of FIG. 1 includes a memory cell array 10, a column redundant memory cell array 12, a row redundant memory cell array 14, a comparator 16, and a write data multiplexer 18.

In FIG. 1, DQ1 to DQ16 represent data I/O pads. The semiconductor memory device of FIG. 1 receives or outputs 16-bit data at a double data rate through the data I/O pads DQ1 to DQ16. The memory cell array 10 includes even memory cell array 10-1 and odd memory cell array 10-2. The even memory cell array 10-1 includes 4 memory cell regions ① to ④, and the odd memory cell array 10-2 includes 4 memory cell regions ⑤ to ⑧. ECSL1 represents a column selecting signal line for selecting 4 bit lines of each of the memory cell regions ① and ③ of the even memory cell array 10-1, and ECSL2 represents a column selecting signal line for selecting 4 bit lines of each of the memory cell regions ② and ④ of the even memory cell array 10-1. OCSL1 represents a column selecting signal line for selecting 4 bit lines of each of the memory cell regions ⑤ and ⑦ of the odd memory cell array 10-2, and OCSL2 represents a column selecting signal line for selecting 4 bit lines of each of the memory cell regions ⑥ and ⑧ of the odd memory cell array 10-2. WL1 represents a row selecting signal line for selecting word lines of each of the memory cell regions ①, ②, ⑤, and ⑥ of the memory cell array 10, and WL2 represents a row selecting signal line for selecting word lines of each of the memory cell regions ③, ④, ⑦, and ⑧ of the memory cell array 10. RCSL represents a redundant column selecting signal line of the column redundant memory cell array 12, and RWL represents a redundant row selecting signal line of the row redundant memory cell array 14. Finally, BL represents a bit line of the memory cell array 10.

Referring to FIG. 1, the memory cell array 10 includes the even memory cell array 10-1 and the odd memory cell array 10-2. The even memory cell array 10-1 includes 4 memory cell regions ① to ④ for storing data in locations selected by the row selecting signal lines WL1 and WL2 and the column selecting signal lines ECSL1 and ECSL2. The 4 memory cell regions ① to ④ each respectively receive 4-bit data EDI1~4, EDI5~8, EDI9~12, and EDI13~16 in a write operation mode, and each respectively output 4-bit data EDO1~4, EDO5~8, EDO9~12, and EDO13~16 in a read operation mode. The odd memory cell array 10-2 includes 4 memory cell regions ⑤ to ⑧ for storing data in locations selected by the row selecting signal lines WL1 and WL2 and the column selecting signal lines OCSL1 and OCSL2. The 4 memory cell regions ⑤ to ⑧ each respectively receive 4-bit data ODI1~4, ODI5~8, ODI9~12, and ODI13~16 in a write operation mode, and each respectively output 4-bit data ODO1~4, ODO5~8, ODO9~12, and ODO13~16 in a read operation mode. The column redundant memory cell array 12 is used to replace a column selecting signal line with a redundant column selecting signal line when a defect occurs in the memory cells connected to the column selecting signal lines ECSL1, ECSL2, OCSL1, and OCSL2 of the memory cell array 10. The row redundant memory cell array 14 is used to replace a row select line with a redundant row select line when a defect occurs in the memory cells connected to the row select lines WL1 and WL2 of the memory cell array 10. The comparator 16 compares, by 4 bits, test data EDO1~4, EDO5~8, EDO9~12, EDO13~16, ODO1~4, ODO5~8, ODO9~12, and ODO13~16 output from the memory cell regions ① to ⑧, respectively, to generate 8-bit comparison result data MA1 to MA8 in a parallel bit test operation mode. The 8-bit comparison result data MA1 to MA8 is output from the memory device through the data I/O pads DQ1, DQ3, DQ5, DQ7, DQ9, DQ11, DQ13, and DQ15. That is, the comparison result data obtained from comparing the 4-bit data output from the memory cell regions ① to ⑧ are output from the memory device through 8 data I/O pads DQ1, DQ3, DQ5, DQ7, DQ9, DQ11, DQ13, and DQ15. The write data multiplexer 18, in a parallel bit test mode, extends 4-bit (or 8-bit) data received from the data I/O pads DQ1, DQ5, DQ9, and DQ13 (or DQ1, DQ3, DQ5, DQ7, DQ9, DQ11, DQ13, and DQ15) to 32-bit data and then outputs 4-bit data EDI1~4, EDI5~8, EDI9~12, EDI13~16, ODI1~4, ODI5~8, ODI9~12, and ODI13~16 to the memory cell regions ① to ⑧, respectively. At this time, 4-bit test data are equally stored in the respective memory cell regions ① to ⑧.

FIG. 2 is a block diagram illustrating the comparator 16 of the semiconductor memory device of FIG. 1 in greater detail. The comparator of FIG. 2 includes a first comparator including blocks 30-1 to 30-16 and a second comparator including blocks 32-1 to 32-8. Operation of the comparator is explained below.

Referring to FIG. 2, the comparator blocks 30-1 to 30-8 compare 2-bit data pairs EDO1, 2 to EDO15, 16, which are output from the even memory cell array 10-1, to generate comparison result data. If both bits of the pair match, comparison result data having a "high" level is generated, whereas if both bits of the pair do not match, comparison result data having a "low" level is generated. Similarly, comparator blocks 30-9 to 30-16 compare-bit data pairs ODO1, 2 to ODO15, 16, which are output from the odd memory cell array 10-2, to generate comparison result data. If both bits of the pair match, comparison result data having a "high" level is generated, whereas if both bits of the pair do not match, comparison result data having a "low" level is generated. Comparator blocks 32-1 to 32-4 compare the 2-bit comparison result data output from the comparators 30-1 to 30-8 in order to output comparison result data MA1 to MA4 from the memory device through data I/O pads DQ1, DQ3, DQ5, and DQ7, respectively. The comparators 32-5 to 32-8 compare 2-bit comparison result data output from the comparators 30-9 to 30-16 to output the comparison result data MA5 to MA8 from the memory device through data I/O pads DQ9, DQ11, DQ13, and DQ15, respectively.

That is, the comparator 16 of FIG. 2 compares 4-bit data output from the memory cell regions ① to ⑧ and outputs the comparison result data MA1 to MA8 from the memory device to the tester using data I/O pads DQ1, DQ3, DQ5, DQ7, DQ9, DQ11, DQ13, and DQ15.

The semiconductor memory device tester determines the addresses of defective memory cells in memory cell regions ① to ⑧ based on the comparison result data MA1 to MA8 output from the data I/O pads DQ1, DQ3, DQ5, DQ7, DQ9, DQ11, DQ13, and DQ15. For example, when the comparison result data MA1 output from the data I/O pad DQ1 has a "low" level, locations within memory cell region ① are regarded as being defective.

However, when the 8-bit data (MA1 to MA8) that is output from the comparators 32-1 to 32-8 is further compared by 2 bits in order to reduce the number of data I/O pads used for a read operation, the tester may not be able to correctly determine the addresses of defective memory cell locations in regions ① to ⑧. Thus, a conventional semiconductor memory device which can receive or output 16-bit data may require at least 8 data I/O pads for the PBT. As a result, the number of the semiconductor memory devices which can be tested simultaneously is limited.

SUMMARY OF THE INVENTION

According to some embodiments of the present invention, a method for testing a memory cell array of a semiconductor memory device in a parallel bit test mode may include selecting first data from one of a plurality of memory regions in the memory array for output from the memory device via an input/output pad, and then selecting second data from another of the plurality of memory regions for output from the memory device via the input/output pad. The method may also include writing test data to the plurality of memory regions, reading the test data from the plurality of memory regions, and comparing the test data from the plurality of memory regions to produce comparison data that corresponds to the plurality of memory regions prior to the selecting steps.

In additional embodiments, the first data may be selected in response to a first control signal, and the second data may be selected in response to a second control signal. The first and second data can be selected from memory regions sharing a row select control line, or from memory regions sharing a column select control line. Alternatively, one of the first and second data can be selected from memory regions sharing a row select control line, and the other of the first and second data can be selected from memory regions sharing a column select control line. The method may also include replacing a defective row select control line with a redundant row select control line from a row redundant memory cell array, and/or replacing a defective column select control line with a redundant column select control line from a column redundant memory cell array. In addition, the memory device may operate at a single data rate or at a double data rate.

According to further embodiments of the present invention, a circuit for testing a memory cell array of a semiconductor memory device in a parallel bit test mode may include a selecting circuit configured to select first data from one of a plurality of memory regions in the memory array for output from the memory device via an input/output pad, and then select second data from another of the plurality of memory regions for output from the memory device via the input/output pad. The circuit may also include a multiplexer configured to write test data to the plurality of memory regions in the memory array, and a comparator circuit that is configured to read data from the plurality of memory regions and produce comparison data corresponding to the plurality of memory regions, wherein the selecting circuit selects the first and second data from the comparison data. In addition, the circuit for testing the memory array may be internal to the semiconductor memory device.

In some embodiments, the selecting circuit may select the first data in response to a first control signal, and the second data in response to a second control signal. Also, the selecting circuit can select both of the first and second data from memory regions sharing a row select control line or from memory regions sharing a column select control line. Alternatively, the selecting circuit can select one of the first and second data from memory regions sharing a row select control line, and the other of the first and second data from memory regions sharing a column select control line. The test circuit may also include a row redundant memory cell array for replacing a defective row select control line with a redundant row select control line, and/or a column redundant memory cell array for replacing a defective column select control line with a redundant column select control line. The memory device may operate at a single data rate or at a double data rate.

DETAILED DESCRIPTION OF EMBODIMENTS

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art. Like numbers refer to like elements throughout.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety.

Figure 1:
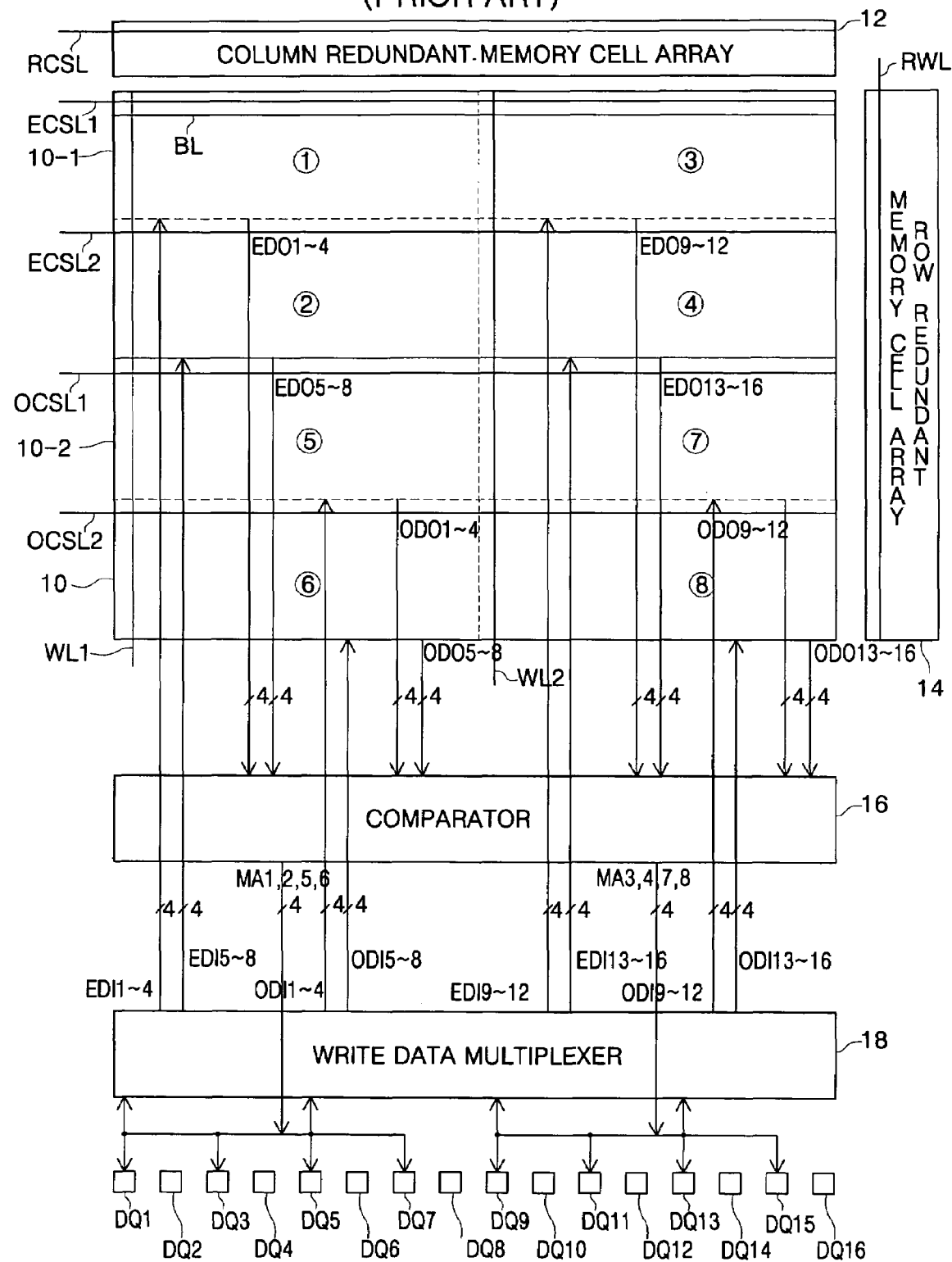
FIG. 1 is a block diagram illustrating a conventional semiconductor memory device having a double data rate.
Figure 2:
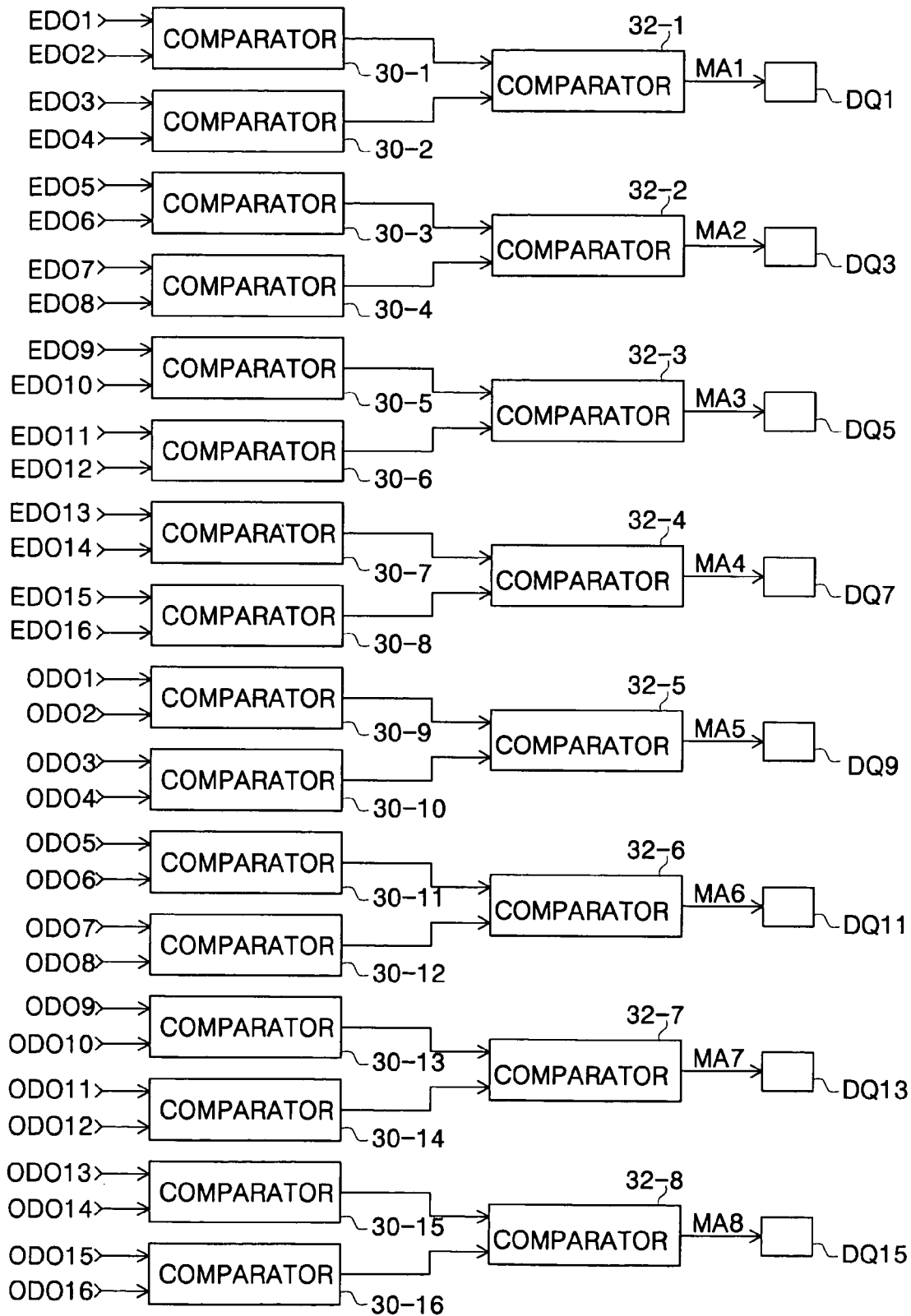
FIG. 2 is a block diagram illustrating a comparator of the semiconductor memory device of FIG. 1.
Figure 3:
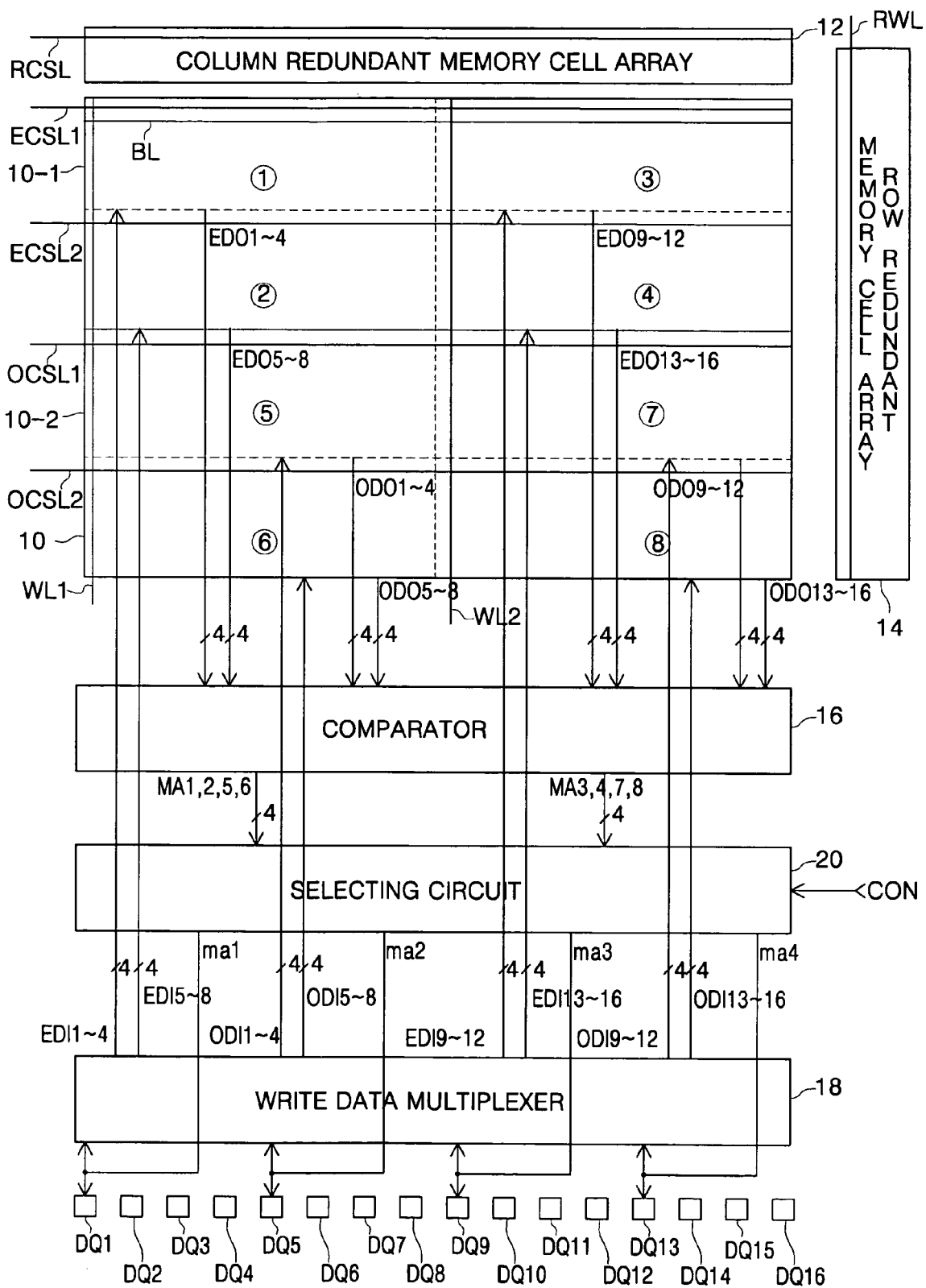
FIG. 3 is a block diagram illustrating a semiconductor memory device having a double data rate according to some embodiments of the present invention.

FIG. 3 is a block diagram illustrating a semiconductor memory device having a double data rate according to embodiments of the present invention. The semiconductor memory device of FIG. 3 includes a selecting circuit 20. Operations of the selecting circuit 20 of FIG. 3 are explained below.

Referring to FIG. 3, when a control signal CON is set to a "low" level in a parallel bit test operation mode, the selecting circuit 20 receives 8-bit comparison result data MA1 to MA8 that is output from the comparator 16 and selects 4-bit comparison result data MA1 to MA4, which corresponds to even memory cell array 10-1, to output as data ma1 to ma4. The 4-bit data ma1 to ma4 are then output from the memory device to the tester through data I/O pads DQ1, DQ5, DQ9, and DQ13.

Still referring to FIG. 3, when a control signal CON is set to a "high" level in a parallel bit test operation mode, the selecting circuit 20 receives 8-bit comparison result data MA1 to MA8 that is output from the comparator 16 and selects 4-bit comparison result data MA5 to MA8, which corresponds to odd memory cell array 10-2, to output as data ma1 to ma4. The 4-bit data ma1 to ma4 are then output from the memory device to the tester through the data I/O pads DQ1, DQ5, DQ9, and DQ13.

Thus, the selecting circuit 20 does not simultaneously output 8-bit comparison result data MA1 to MA8 through 8 data I/O pads, but instead outputs either 4-bit comparison result data MA1 to MA4 or 4-bit comparison result data MA5 to MA8 as 4-bit data ma1 to ma4 in response to a control signal CON. The 4-bit data ma1 to ma4 are output through the 4 data I/O pads DQ1, DQ5, DQ9, and DQ13.

In FIG. 3, the control signal CON may be set to a "high" or "low" level by inputting a mode setting code to a mode setting register of the semiconductor memory device during a mode setting operation.

In summary, when the semiconductor memory device of FIG. 3 is in parallel bit test operation mode, a control signal CON is set to a "low" level, and the comparison result data MA1 to MA4 that corresponds to memory cell regions ①to ④ of even memory cell array 10-1 is output from the device through 4 data I/O pads. Thereafter, the control signal CON is set to a "high" level, and comparison result data MA5 to MA8 that corresponds to memory cell regions ⑤ to ⑧ of odd memory cell array 10-2 is output from the device through the same 4 data I/O pads.

As such, the parallel bit test method of the semiconductor memory device of FIG. 3 performs a test read operation for the even memory cell array before the odd memory cell array, and thus a smaller number of data I/O pads are used in a test. Therefore, a tester can simultaneously test a larger number of semiconductor memory devices according to embodiments of the present invention.

Figure 4:
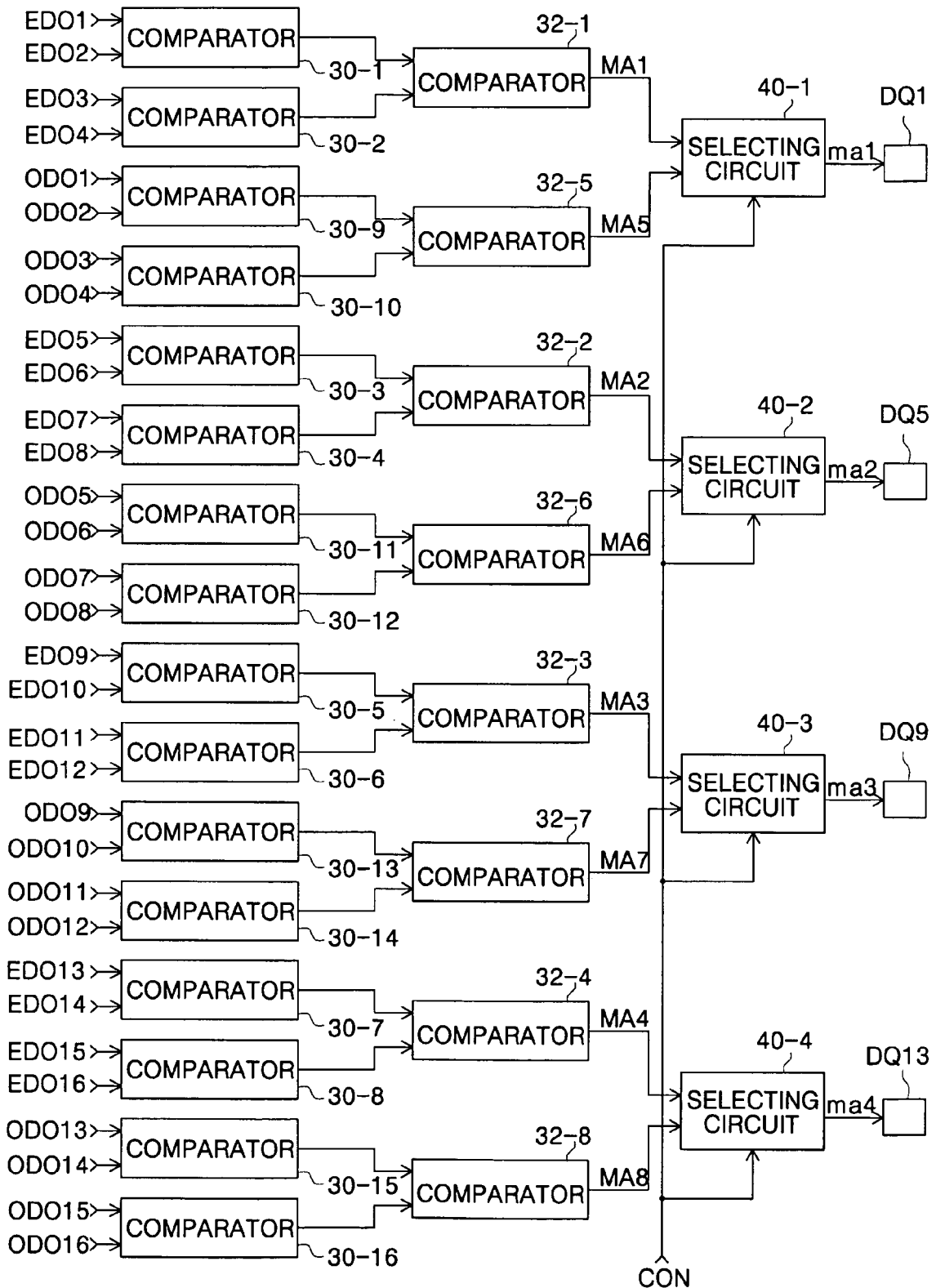
FIG. 4 is a block diagram illustrating a comparator and a selecting circuit of the semiconductor memory device of FIG. 3.

FIG. 4 is a block diagram illustrating the comparator and the selecting circuit of the semiconductor memory device of FIG. 3 in greater detail. The comparator 16 includes comparator blocks 30-1 to 30-16 and 32-1 to 32-8, and the selecting circuit 20 includes selecting circuit blocks 40-1 to 40-4.

Referring to FIG. 4, when a control signal CON is set to a "low" level, selecting circuit blocks 40-1 to 40-4 output comparison result data MA1 to MA4 from comparator blocks 32-1 to 32-4 as data ma1 to ma4, which are output from the memory device through the data I/O pads DQ1, DQ5, DQ9, and DQ13. When a control signal CON is set to a "high" level, selecting circuit blocks 40-1 to 40-4 output the comparison result data MA5 to MA8 from the comparators 32-5 to 32-8 as data ma1 to ma4, which are output from the memory device through the same data I/O pads DQ1, DQ5, DQ9, and DQ13.

That is, when a control signal CON is set to a "low" level, the comparator and the selecting circuit of FIG. 4 output the comparison result data MA1 to MA4 that corresponds to memory cell regions ① to ④ of even memory cell array 10-1 through the 4 data I/O pads DQ1, DQ5, DQ9, and DQ13. On the other hand, when a control signal CON is set to a "high" level, the comparator and the selecting circuit of FIG. 4 output the comparison result data MA5 to MA8 that corresponds to memory cell regions ⑤ to ⑧ of odd memory cell array 10-2 through the same 4 data I/O pads DQ1, DQ5, DQ9, and DQ13. Therefore, the semiconductor memory device of FIG. 3 can perform a parallel bit test operation using only 4 data I/O pads, allowing twice as many devices to be tested as compared to conventional semiconductor memory devices.

Further, although not shown, the semiconductor memory device can include two selecting circuits and two control signals, so that a read operation is performed four times for a parallel bit test, and the comparison result data may be output by 2 bits from the memory device through only 2 data I/O pads. In other words, in this configuration the device can output two bits at a time rather than four bits at a time as described above. Thus, even more semiconductor memory devices can simultaneously be tested.

Also, while some embodiments of the present invention are described with reference to memory devices that operate at a double data rate, embodiments of the present invention can be applied to semiconductor memory devices which operate at a single data rate as well.

For example, in some embodiments according to the invention, a memory cell array of a semiconductor memory device which operates as a single data rate internally receives or outputs 32-bit data, the number of selected row selecting signal lines is 2, and the number of selected column selecting signal line is 4. When a test is performed by a conventional parallel bit test method, at least 8 data I/O pads may be required, but when a test is performed by the present invention, only 2 or 4 data I/O pads may be required. That is, further embodiments of the present invention may operate such that a read operation can be repeatedly performed until all of the test data has been read and output by the selecting circuit.

Figure 5:
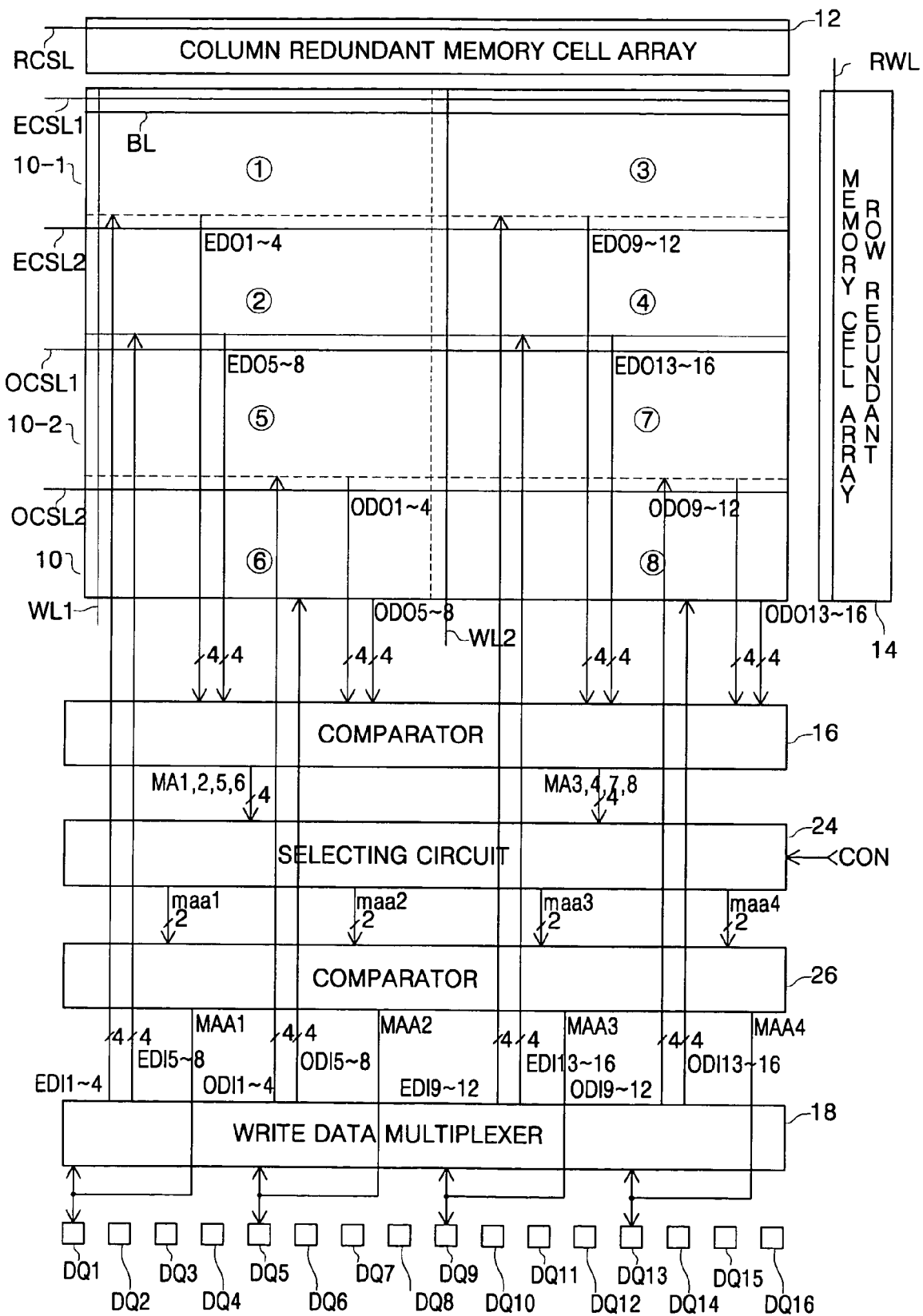
FIG. 5 is a block diagram illustrating a semiconductor memory device having a double data rate according to some embodiments of the present invention.

FIG. 5 is a block diagram illustrating a semiconductor memory device having a double data rate according to further embodiments of the present invention. The semiconductor memory device of FIG. 5 includes a selecting circuit 24 and a second comparator 26.

Referring to FIG. 5, the selecting circuit 24 receives 8-bit comparison result data MA1 to MA8 output from the comparator 16. When a control signal has a "low" level, the selecting circuit 24 selects and outputs, by 2 bits, the comparison result data (MA1, MA5), (MA2, MA6) and (MA3, MA7), (MA4, MA8) corresponding to memory cell regions (①, ⑤, ②, ⑥) and (③, ⑦, ④, ⑧), respectively, connected to row select lines WL1 and WL2 of memory cell array 10. On the other hand, when a control signal CON has a "high" level, the selecting circuit 24 selects and outputs, by 2 bits, the comparison result data (MA1, MA3), (MA2, MA4), (MA5, MA7), and (MA6, MA8) corresponding to the memory cell regions (①, ③), (②, ④), (⑤, ⑦), and (⑥, ⑧), connected to column select lines ECSI1, ECSL2, OCSL1, and OCSL2 of the memory cell array 10, respectively.

Still referring to FIG. 5, the comparator 26 outputs first comparison result data MAA1, MAA2, MAA3, and MAA4, which is generated by comparing the 2-bit comparison result data (MA1, MA5), (MA2, MA6) and (MA3, MA7), (MA4, MA8) output from the selecting circuit 24, to the data I/O pads DQ1, DQ5, DQ9, and DQ13 when the control signal has a "low" level. Next, the comparator 26 outputs second comparison result data MAA1, MAA2, MAA3, and MAA4, which is generated by comparing the 2-bit comparison result data (MA1, MA3), (MA2, MA4), (MA5, MA7), and (MA6, MA8), to the same data I/O pads DQ1, DQ5, DQ9, and DQ13 when the control signal is set to a "high" level. The data I/O pads DQ1, DQ5, DQ9, and DQ13 output the respective comparison result data from the memory device to the external semiconductor memory device tester.

Thus, when control signal CON is set to a "low" level, a tester can determine the addresses of memory cells connected to a defective word line based on the comparison result data output from the memory device through data I/O pads DQ1, DQ5, DQ9, and DQ13. Similarly, when control signal CON is set to a "high" level, the tester can determine the addresses of memory cells connected to a defective bit line based on the comparison result data output from the memory device through the same data I/O pads DQ1, DQ5, DQ9, and DQ13.

Moreover, when control signal CON is set to a "low" level, the tester can replace the defective word line with a redundant word line from row redundant memory cell array 14 to thereby repair the semiconductor memory device. However, if replacing the defective word line does not perfectly repair the semiconductor memory device, control signal CON is set to a "high" level, and the tester can replace the defective bit line with a redundant bit line from column redundant memory cell array 12 to thereby repair the semiconductor memory device. In other words, when the semiconductor memory device is not repaired by replacing a word line, the semiconductor memory device can be repaired by replacing a bit line.

In summary, the semiconductor memory device of FIG. 5 outputs the comparison result data generated by comparing data output from the memory cell regions connected to the same row select lines through the data I/O pads before outputting the comparison result data generated by comparing data output from the memory cell regions connected to the same column select lines through the data I/O pads. The number of data I/O pads depends on the greater of the number of row select lines and the number of column select lines. In the semiconductor memory device of FIG. 5, the number of row select lines is 2, and the number of column select lines is 4, so 4 data I/O pads are required to perform the parallel bit test. Therefore, since the semiconductor memory device of FIG. 5 uses only 4 data I/O pads for a parallel bit test, the tester can test 8 devices, which is twice as many as the conventional art.

Figure 6:
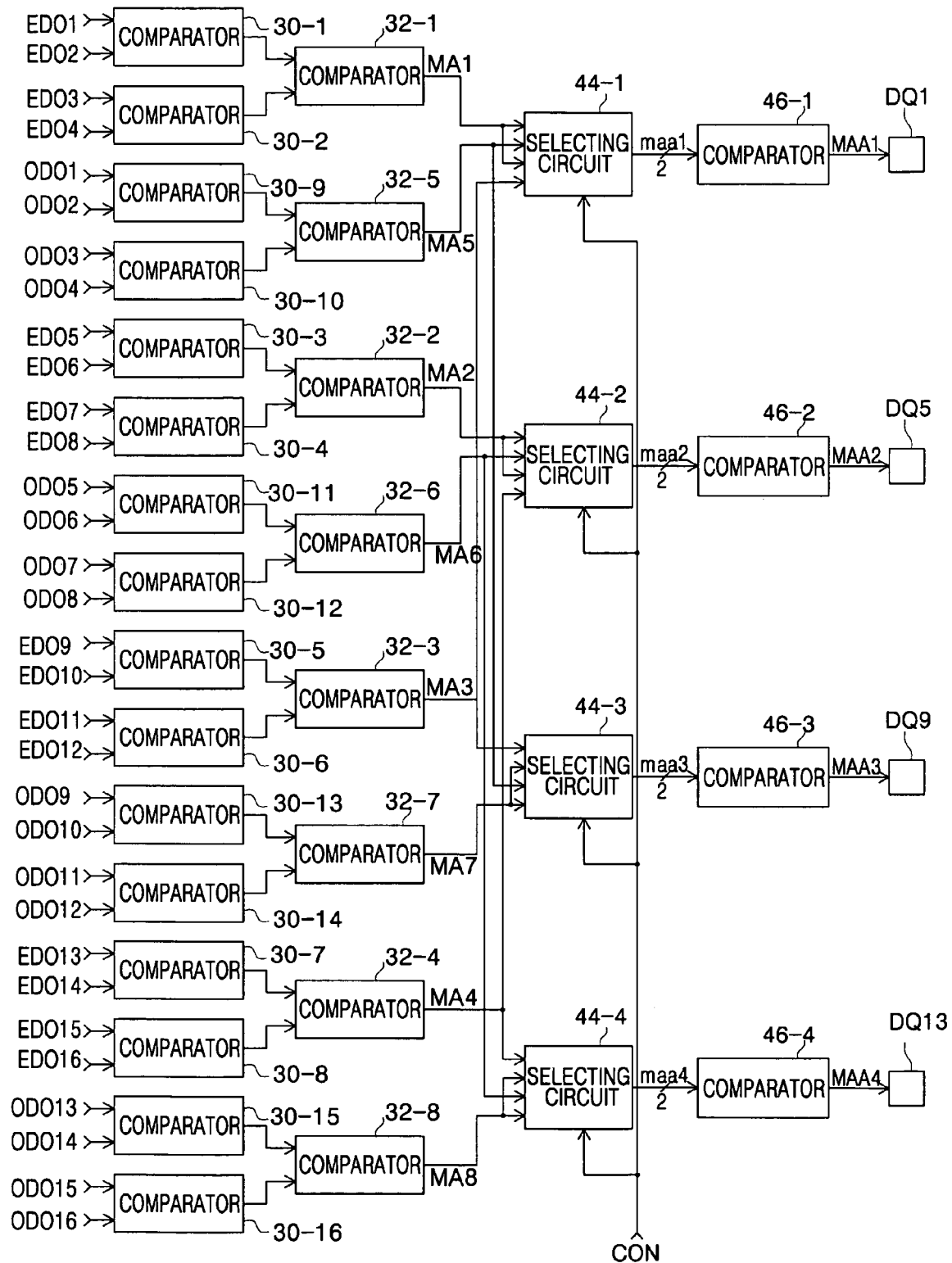
FIG. 6 is a block diagram illustrating a comparator and a selecting circuit of the semiconductor memory device of FIG. 5.

FIG. 6 is a block diagram illustrating the comparator and the selecting circuit of the semiconductor memory device of FIG. 5 in greater detail. The comparator of FIG. 6 includes comparator blocks 46-1 to 464, and the selecting circuit of FIG. 6 includes selecting circuit blocks 44-1 to 44-4.

Referring to FIG. 6, selecting circuit block 44-1 selects 2-bit comparison result data (MA1, MA5) or (MA1, MA3) to output as data maa1 in response to a control signal CON. Selecting circuit block 44-2 selects 2-bit comparison result data (MA2, MA6) or (MA2, MA4) to output as data maa2 in response to a control signal CON. Selecting circuit block 44-3 selects 2-bit comparison result data (MA3, MA7) or (MA5, MA7) to output as data maa3 in response to a control signal CON. Selecting circuit block 444 selects 2-bit comparison result data (MA4, MA8) or (MA6, MA8) to output as data maa4 in response to a control signal CON.

Still referring to FIG. 6, comparator blocks 46-1 to 464 compare, by 2 bits, the data maa1 to maa4 that is output from selecting circuit blocks 44-1 to 44-4 to generate comparison result data MAA1 to MAA4, respectively, which are output from the memory device through the data I/O pads DQ1, DQ5, DQ9, and DQ13.

Although some embodiments of the present invention are described with reference to memory devices that operate at a double data rate, embodiments of the present invention can be applied to reduce the number of data I/O pads used for a parallel bit test in semiconductor memory devices which operate at a single data rate as well.

For example, in some embodiments of the invention, a memory cell array of a semiconductor memory device which operates as a single data rate internally receives or outputs 32-bit data, the number of selected row selecting signal lines is 2, and the number of selected column selecting signal line is 4. When a test is performed by a conventional parallel bit test method, at least 8 data I/O pads may be required, but when a test is performed by the present invention, only 4 data I/O pads may be required. That is, further embodiments of the present invention may operate such that a read operation may be repeatedly performed until all of the comparison result data has been selectively output by the selecting circuit.

Therefore, circuits and methods according to embodiments of the present invention may allow fewer data I/O pads to be used in parallel bit testing. As a result, a greater number of semiconductor memory devices can simultaneously be tested.

In the drawings and specification, there have been disclosed embodiments according to the invention and, although, specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

That which is claimed is:

1. A method for testing a semiconductor memory device including nm memory cell regions for respectively outputting x-bit data when n word lines and m column selecting signal lines are selected, and each half of the nm memory cell regions is a first memory cell array and a second memory cell array, the method comprising:

extending y-bit data received through y data I/O pads to (nm×x)-bit data to write the x-bit data to each of the nm memory cell regions in a test data write step; and comparing the x-bit data output from each of the nm memory cell regions to generate nm-bit comparison result data, and sequentially outputting y-bit comparison result data selected by selecting, by y bits generated from the first memory cell array or from the second memory cell array, the nm-bit comparison result data in response to a control signal to the y data I/O pads, respectively, in a test data read step, wherein n is an integer equal or greater than 2, wherein m is an integer equal or greater than 4, wherein x and y are integers greater than 1, wherein nm comprises n multiplied by m, and wherein y is less than nm.

2. The method of claim 1, wherein in the test data write step, when the x-bit data is written to the respective nm memory cell regions, the x-bit data written to the respective nm memory cell regions are same-bit data.

3. The method of claim 1, wherein the test data read step comprises:

respectively comparing the x-bit data output from each of the nm memory cell regions to generate the nm-bit comparison result data in a comparing step; and outputting the y-bit comparison result data selected by selecting, by y bits, the nm comparison result data in response to the control signal to the y data I/O pads in a selecting step.

4. A method for testing a semiconductor memory device including nm memory cell regions for respectively outputting x-bit data when n word lines and m column selecting signal lines are selected, the method comprising:

extending y-bit data received through y data I/O pads to (nm×x)-bit data to write the x-bit data to each of the nm memory cell regions in a test data write step; and comparing the x-bit data output from each of the nm memory cell regions to generate nm-bit comparison result data, grouping and outputting the nm-bit comparison result data into y groups by bit data generated with respect to corresponding n word lines or with respect to corresponding m column selecting signal lines in response to a control signal, and outputting y-bit comparison result data generated by respectively comparing the y grouped bit data through the y data I/O pads in a test data read step, wherein n is an integer equal or greater than 2, wherein m is an integer equal or greater than 4, wherein x and y are integers greater than 1, wherein nm comprises n multiplied by m, and wherein y is less than nm.

5. The method of claim 4, wherein in the test data write step, when x-bit data are written to the respective nm memory cell regions, the x-bit data written to the nm memory cell regions are same-bit data.

6. The method of claim 5, wherein the test data read step comprises:

respectively comparing the x-bit data output from each of the nm memory cell regions in a first comparing step;

grouping and outputting the nm-bit comparison result data into y groups by bit data generated with respect to corresponding n word lines or with respect to corresponding m column selecting signal lines in response to a control signal; and outputting the y-bit comparison result data generated by respectively comparing the y grouped bit data through the y data I/O pads.

7. The method of claim 6, wherein y is set to at least n when n is greater than m and is set to at least m when m is greater than n.

8. A semiconductor memory device, comprising:

nm memory cell regions configured to respectively output x-bit data when n word lines and m column selecting signal lines are selected, and each half of the nm memory cell regions is a first memory cell array and a second memory cell array;

a test data write circuit configured to extend y-bit data received through y data I/O pads to (nm×x)-bit data to write the x-bit data to each of the mu memory cell regions; and a test data read circuit configured to compare the x-bit data output from each of the nm memory cell region to generate nm-bit comparison result data, and sequentially output y-bit comparison result data selected by selecting, by y bits generated from the first memory cell array or from the second memory cell array, the nm-bit comparison result data in response to a control signal to the y data I/O pads, respectively, wherein n is an integer equal or greater than 2, wherein m is an integer equal or greater than 4, wherein x and y are integers greater than 1, wherein nm comprises n multiplied by m, and wherein y is less than nm.

9. The device of claim 8, wherein in the test data write circuit, when x-bit data is written to the respective nm memory cell regions, the x-bit data written to the respective nm memory cell regions are same-bit data.

10. The device of claim 8, wherein the test data read circuit includes:

a comparator configured to respectively compare the x-bit data output from each of the nm memory cell regions to generate the nm-bit comparison result data; and a selecting circuit configured to output the y-bit comparison result data selected by selecting, by y bits generated from the first memory cell array or from the second memory cell array, the nm comparison result data in response to the control signal to the y data I/O pads.

11. A semiconductor memory device, comprising:

nm memory cell regions configured to respectively output x-bit data when n word lines and m column selecting signal lines are selected;

a test data write circuit configured to extend y-bit data received through y data I/O pads to (nm×x)-bit data to write the x-bit data to each of the nm memory cell regions; and a test data read circuit configured to compare the x-bit data output from each of the nm memory cell regions to generate nm-bit comparison result data, group and output the nm-bit comparison result data into y groups by bit data generated with respect to corresponding n word lines or with respect to corresponding m column selecting signal lines in response to a control signal, and output y-bit comparison result data generated by respectively comparing the y grouped bit data through the y data I/O pads, wherein n is an integer equal or greater than 2, wherein m is an integer equal or greater than 4, wherein x and y are integers greater than 1, wherein nm, comprises n multiplied by m, and wherein y is less than nm.

12. The device of claim 11, wherein the test data read circuit includes:

a first comparator configured to respectively compare the x-bit data output from each of the nm memory cell regions;

a selecting circuit configured to group and output the nm-bit comparison result data into y groups by bit data generated with respect to corresponding n word lines or with respect to corresponding m column selecting signal lines in response to the control signal; and a second comparator configured to output the y-bit comparison result data generated by respectively comparing the y grouped bit data through the y data I/O pads.

13. The device of claim 12, wherein y is set to at least n when n is greater than m and is set to at least in when m is greater than n.

* * * * *